(12) United States Patent
Scari et al.

(10) Patent No.: US 6,325,110 B1
(45) Date of Patent: Dec. 4, 2001

(54) WOVEN FABRIC REINFORCEMENT TO OPTIMIZE DIMENSIONAL STABILITY

(75) Inventors: Diego Scari; Marco Scari, both of Brugherio (IT)

(73) Assignee: Gividi Italia S.p.A., Milan (IT)

( * ) Notice: Subject to any disclaimer, the term of this patent is extended or adjusted under 35 U.S.C. 154(b) by 0 days.

(21) Appl. No.: 09/310,723

(22) Filed: May 13, 1999

(30) Foreign Application Priority Data

Mar. 31, 1999 (IT) ................................. MI99A0665

(51) Int. Cl.[7] .............. D03D 1/00; D03D 15/00; H05K 1/03
(52) U.S. Cl. ............ 139/426 TW; 442/2; 442/43; 442/60; 428/901; 428/219
(58) Field of Search .............. 139/426 TW; 428/901, 428/219; 442/43, 2, 189, 60; 26/DIG. 1

(56) References Cited

U.S. PATENT DOCUMENTS

| | | | |
|---|---|---|---|
| 889,827 | * | 6/1908 | Teufel ............... 139/426 TW |
| 1,100,060 | * | 6/1914 | Earnshaw ........... 139/426 TW |
| 1,677,260 | * | 7/1928 | Whitman ............ 139/426 TW |
| 2,049,743 | * | 8/1936 | Mack ................. 139/426 TW |
| 2,215,938 | | 9/1940 | Schonholzer . |
| 2,400,276 | * | 5/1946 | Whitman ............ 139/426 TW |
| 2,400,379 | * | 5/1946 | Whitman ............ 139/426 TW |
| 2,691,391 | * | 10/1954 | Jamison et al. ..... 139/426 TW |
| 5,662,990 | | 9/1997 | Scari . |
| 5,752,550 | | 5/1998 | Scari et al. . |

FOREIGN PATENT DOCUMENTS

| | | |
|---|---|---|
| 0399219 | 11/1990 | (EP) . |
| 2510624 | 2/1983 | (FR) . |

\* cited by examiner

*Primary Examiner*—Andy Falik
(74) *Attorney, Agent, or Firm*—Birch, Stewart, Kolasch & Birch, LLP

(57) ABSTRACT

A woven fabric reinforcement characterized by a weight of up to 190 grams per square meter, with a number of warp yarns which is at least 55% of the total number of yarns, and where the crossovers between warp yarns and weft yarns is between 200 and 315 crossovers per square centimeter. Yarn deposition is such that the sum of each yarn torsion component in warp and in weft is balanced and equal to zero. This fabric is used in laminated composite structures, in particular printed circuit boards.

4 Claims, 3 Drawing Sheets

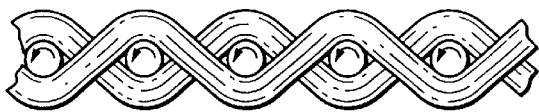
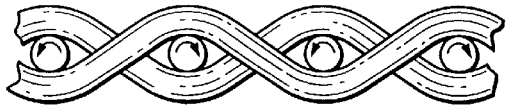
FIG.3
PRIOR ART
FIG.4
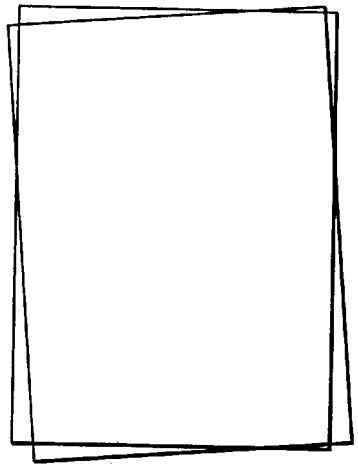
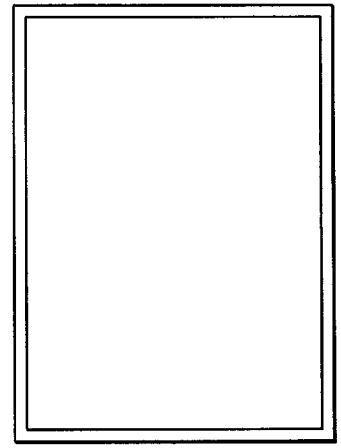
FIG.5
PRIOR ART
FIG.6

WOVEN FABRIC REINFORCEMENT TO OPTIMIZE DIMENSIONAL STABILITY

The present invention relates to a woven fabric reinforcement to be used in laminated composite structures, in particular for dielectric laminates and printed circuit boards. The specific fabric geometry and yarn disposition contribute to a balanced fabric structure that greatly reduces the movements of the resulting laminated composite structure during the successive mechanical and thermal processes for the manufacture of printed circuit boards.

BACKGROUND OF THE INVENTION

Reinforcement fabrics are successfully used today in the production of advanced dielectric composites for the electrical and electronic industries. In particular, for the production of laminates, fiberglass fabric dominates the market in the reinforcement of all types of thermosetting and thermoplastic resins.

The laminates have incorporated on one or both sides a copper foil at after several processes of photography, etching, drilling, finishing becomes a well known printed circuit board In a multi-layer board, additional layers of fabric reinforced resin and additional layers of copper foil, are laminated together and undergo additional processes of photography, etching, drilling and finishing to become rather complex multi-layer printed circuit boards.

Printed circuits boards, and the laminates used for their production, are required to have superior dimensional stability, the lowest possible bow and twist and very limited and predictable movement on the X & Y axes during the successive mechanical and thermal process steps.

Currently produced reinforcement fabrics are normally of plain weave construction, and are characterized by a large number of crossovers between warp yarns and weft yams e.g. about 500 or more which was determined during the 1950's as a consequence of the technology capabilities available then, and which has remained mostly unchanged.

The yarn used) particularly fiberglass yarn, has an average number of twist per meter ranging from 12 up to 40 turns per meter. The direction of twist commonly used is Z-twist. In Z-twist the filaments assume an ascending left to right configuration, as in the central portion of the letter Z (see FIG. 1). In S-twist the filaments assume an ascending right to left configuraton, as in the central portion of the letter S (see FIG. 2).

The performance challenge comes from recent technology advances in the production of printed circuit boards (and in particular high-layer count multi-layer boards), such as build-up process, micro-vias, and laser drilling, which require higher dimensional stability of the laminate and a more evenly distributed reinforcement inside the resi matrix.

U.S. Pat. No. 5,662,990 discloses that the use of untwisted yarn in the fabric reinforcement greatly improves the performance of the resulting laminate and printed circuit board. However, even better results are further obtained by changing the fabric geometry as described herein, rather than just relying only on better characteristics of single yarns.

SUMMARY OF THE INVENTION

It has now been discovered that the geometry of the reinforcement fabric is principally responsible for the dimensional stability behavior of the resulting laminated composite structure. The outstanding effects of the present invention have been remarkably obtained also for the production of thin laminates where fine fabrics with thickness ranging from 0.035 mm. up to 0.13 mm. are used, and assembled as ural in a limited number of plies. The research that was conducted brought a distinction in regards to reinforcement fabrics: above 190 grams per square meter optimal results were obtained with unidirectional fabrics, as in the commonly owned U.S. Pat. No. 5,752,550, while below 190 grams per square meter the use of unidirectional fabric gave sub-optimal results. Moreover, three primary characteristics were found to contribute to the dimensional stability behavior in an orthogonal reinforcement fabric of weight up to 190 grams per square meter in particular of plain weave construction:

1. Fabric construction geometry is extremely important: because of the fact that all finishing and impregnation production steps use continuous processes that unwind, pull, and rewind the fabric in the warp direction, it has been discovered that it is necessary to have in the warp direction at least 55% and up to about 65% of the total number of warp and weft yarns in order to maintain a satisfactory stability of the reinforcement fabric. This results in a better behavior of the dielectric laminates and printed circuit boards.

2. The number of crossovers between wrap yarns and weft yarns must be kept within a limited range per unit area, regardless of fabric weight. Up to a weight per unit area of 190 grams per square meter, the results indicate that the optimal range is between 200 and 315 crossovers per square centimeter. Outside this range, the resulting laminated composite structure shows erratic and unpredictable behavior 3. The third most influential factor in the dimensional stability behavior of laminated composite structures is the torsion present in each warp and weft yarn. It has been discovered that by utilizing about 50% (±10%) of the number of warp or weft yarns with counterclockwise torsion (Z-twist) and the remaining about 50% (±10%) of yarns with clockwise torsion (S-twist) of the same magnitude, the reinforcement fabric has an absolute neutral behavior it the resulting laminated composite structure. Torsion levels must be kept as low as possible for optimal results, but the neutral behavior has been discovered also at higher torsion levels, so that good results have been obtained in the full range between 0.4 to 40 turns per meter. This can be easily explained if we think of each yarn as a group of filaments (several 100's) having an elicoidal form. Thus, at each thermal stress the yarn behaves like a spring, where heating at high temperatures produces an elongation and cooling produces a contaction. Now, if each yarn has the same torsion direction, these thermal stresses will produce a twisting of the whole laminated composite structure. However, because the elongation due to heating and the contraction due to cooling are not linear, the outcome is a geometric deformation of the resulting laminated composite structure, which causes misregistration of the laminate in the subsequent process steps needed to form the final printed circuit board. A similar behavior can be described for mechanical stresses or combined mechanical and thermal stresses.

In a preferred embodiment of the present invention the torsion of each counterclockwise twisted yarn is neutralized by the torsion of the adjacent clockwise twisted yarn. In fact, in a preferred embodiment of the invention, each next warp yarn has opposite torsion of equal magnitude compared to the preceding warp yarn, and each next weft yarn has opposite torsion of equal magnitude compared to the preceding weft yarn. This yarn disposition acts in a similar way as a counterbalancing shaft in an automobile engine, which is designed to produce a counter-effect to the vibrations created by the engine main shaft (although the dynamic nature of that principle is altogether different from the quasi-static nature of the present invention).

Such fabric geometry and yarn disposition result in an optimally neutral behavior of the woven fabric reinforcement and the resulting laminated composite structure.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The subject of the present invention will be described in the detailed description that follows also in conjunction with the drawings which are given by way of illustration only, and thus are not limitative of the present invention, and in which:

FIG. 3 shows the profile of the prior art reinforcement fabric;

FIG. 4 shows the profile of a reinforcement fabric according to the present invention;

FIG. 5 shows the X-Y movement of a laminate produced with 2116 fabric (state of the art);

FIG. 6 shows the X-Y movement of a laminate produced with a reinforcement fabric according to the present invention.

DETAILED DESCRIPTION OF THE INVENTION

Figure 1:
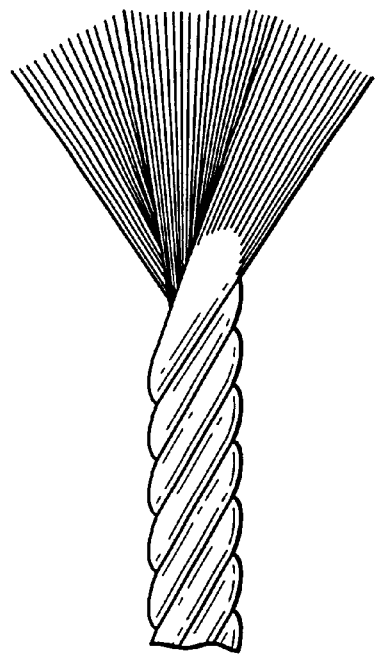
FIG. 1 shows the definition of counterclockwise or Z-twist.
Figure 2:
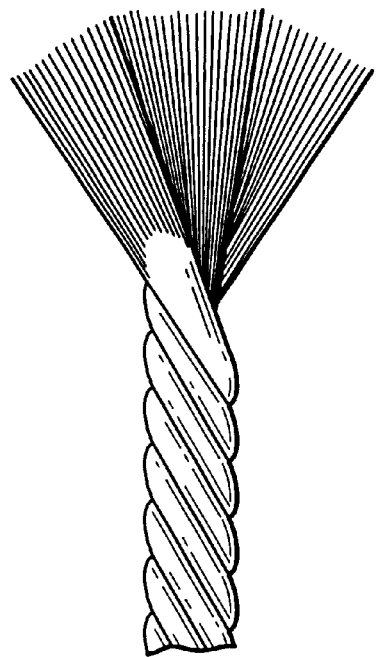
FIG. 2 shows the definition of clockwise or S-twist.
Figure 7:
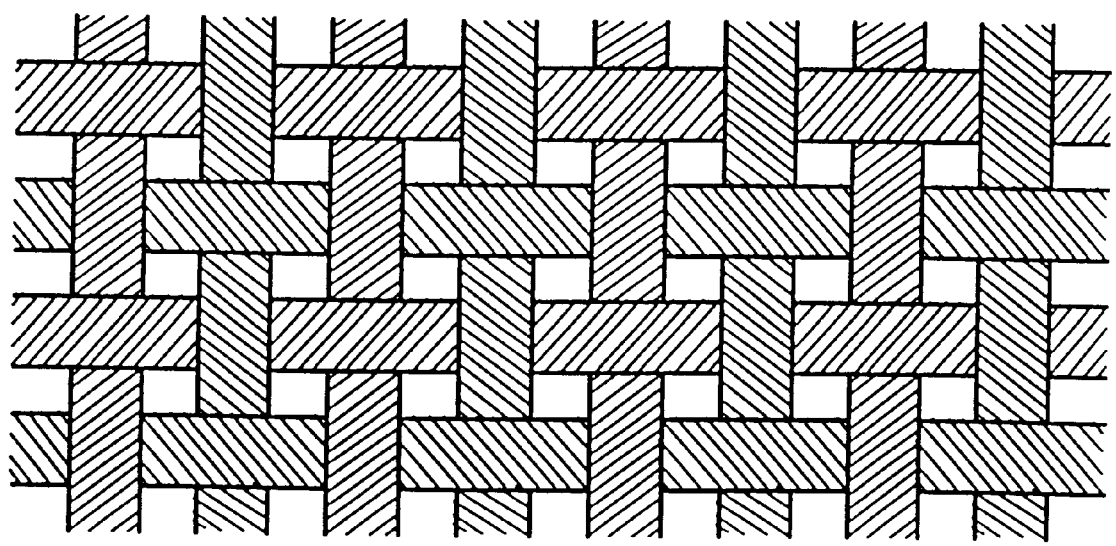
FIG. 7 shows warp and weft yarn disposition for the present invention.

The process needed to produce reinforcement fabric, in particular glass fabric, follows the following steps:
1. Warping Operation Several hundred yarns are gathered together to produce so-called primary beams. This is used because normally the numbers of warp yarns needed to produce a fabric is go large that a single machine able to process all the warp yarns at once time would be inefficient in terms of quality and productivity.
2. Slashing Operation A certain number of primary beams are assembled together to form the warp yarns of the fabric, by winding all the yarns on a so-called loom beam. At the same time a size is applied to each yarn to strengthen it and to increase its performance in the high speed looms used today.

At present, the yarn used in both warp and weft directions of a reinforcement fabric, in particular glass fabric, has always a counterclockwise torsion called Z-twist. For this reason, primary beams are normally produced without limitations as to their number, since they are all constructed in the same way. For example, it a particular fabric style has 3000 warp yarns, its construction can be performed in many ways, including the following:

A. 4 primary beams of 750 warp ends cash

B. 5 primary beams of 600 warp ends each

C. 6 primary beams of 500 warp ends each

According to the preferred embodiment of the present invention the number of primary beams must always be even, in order to evenly distribute Z-twist and S-twist yarns. As an example, items A. and C. above would have 50% of the number of primary beams made with counterclockwise torsion (Z-twist) and 50% of the number of primary beams made with clockwise torsion (S-twist), respectively. By alternating the Z-twist and S-twist primary beams one by one in the slashing machine creel, and having care to follow the same procedure in the thread-in of the machine reeds, the resulting fabric will have oven warp yarns with Z-twist and odd warp yarns with S-twist. It is possible to alternate them differently, as long as about 50% of the number of warp yarns are with Z-twist and the remaining about 50% of the number of warp yarns are with S-twist, and vice versa.
3. Weaving Operation The weaving operation is performed on weaving machines called looms. The operation consists in intertwining warp yarns and weft yarns as to obtain the desired fabric construction. Yarns that run vertically along the material path (at 0°) form the warp, and those arranged crosswise (at 90°) form the weft. The intertwining arrangement between warp yarns and weft yarns is known as the weave. The reinforcement fabrics envisaged in the present invention are of different weaves such as satin, crowfoot, twill, basket, and other orthogonal weave types. A preferred embodiment of the present invention utilizes plain weave as the weave type.

The types of looms used presently are equipped for inserting the weft into the fabric with a double weft feeder in order to decrease weft insertion speed. The present high speed of air-jet or rapier looms requires this double insertion equipment which is fed by two independent yarn bobbins to drastically lower weft tension and thus avoiding overstress of the yarn. In order to have a balanced weft, as per the present invention, it is simple to use one yarn bobbin with Z-twist and the other yarn bobbin with S-twist. Because the double insertion equipment draws alternatively a weft yarn from the first bobbin and the next weft yarn from the second yarn bobbin, we can easily obtain the described balanced weft and resulting fabric.
4. Finishing Operation The reinforcement fabric obtained with the above described process can be treated in the finishing operation using conventional technology, which comprises a desizing operation, thermal or chemical, and the treatment with bonding agents in a finishing line.

Reinforcement fabric constructions, in particular glass reinforcement fabrics, used by the laminate producers are characterized by different weights, and particularly in the range of from 25 grams per square meter up to 190 grams per square meter; they are characterized by having a high number of crossovers between warp and weft yarns, e.g. 500 or more. Crossovers are the points in the fabric structure where warp yarns and weft yarns cross each other. In a plain weave fabric, each crossover where a warp yarn runs on top of a weft yarn (this warp yarn is called a raiser yarn) is adjacent to a crossover where a warp yarn runs below a weft yarn (this warp yarn is called a sinker yarn). This is repeated in both the warp direction and the weft direction in a uniform way, so that if a plot of raiser yarns (marked with a black square) and sinker yarns (marked with a white square) is produced, the resulting image will have a checker board pattern.

The undulated path that warp and weft yarns have to follow has been found to be critical in the behavior of the resulting laminated composite structure and printed circuit board, where a higher number of crossovers determines additional stresses in the subsequent thermal and mechanical process steps, therefore determining and non-repeatable behavior.

In FIGS. 3 and 4 two different fabrics having same weight and similar thickness but different number of crossovers are depicted. It is evident that the reduced number of wasp yarns and weft yarns per unit area is compensated by higher yarn count (weight of yarn) to obtain the same weight of the fabric per unit area.

A well known reinforcement fabric of about 100 grams per square meter weight is code-named 2116 (see IPC-EG-140 specifications by The Institute for Interconnecting and Packaging Electronic Circuits). In this case fabric construction is as follows:

23.6 yarns per cm. in warp 22.8 yarns per cm. in weft

From the above data we can resume that the number of warp yarns is 50.86% of the total number of warp and weft yarns, that the total number of crossovers is 538 crossovers per square centimeter, and that no requirement is specified for the number of twists needed, nor for their direction.

A reinforcement fabric of the same weight per square area according to the present invention has the following characteristics;

20 yarns per cm. in warp 12.6 yarns per cm. in weft

From the above data we can resume that the number of warp yarns is 61.35% of the total number of warp and weft yarns, that the total number of crossovers is 252 crossovers per square centimeter, and that the requirements for the number of twists needed and their disposition is according to the description given previously i.e. essentially equal torsion.

When we compare test results of dimensional stability of the resulting laminated composite structure, the data are given in the Table and FIGS. 5 and 6 show the different movements of the laminates produced with fabric style 2116 (FIG. 5) and with a reinforcement fabric of the same weight per square area produced according to the present invention (FIG. 6), respectively.

TABLE

| | Dimensional Stability results | | | |
| --- | --- | --- | --- | --- |
| | Dimensional Stability in X-Y | | | |
| Fabric type | $\Delta \bar{x}$ [ppm] | $\sigma x$ [ppm] | $\Delta \bar{y}$ [ppm] | $\sigma y$ [ppm] |
| 2116 | 215 | 31 | 150 | 25 |
| Present invention | 120 | 12 | 80 | 9 |

Where: $\Delta \bar{x}$=Average differential movement in the x-direction in ppm (parts per million);

$\sigma x$=Standard deviation of differential movement in the x-direction in ppm (parts per million);

$\Delta \bar{y}$=Average differential movement in the y-direction in ppm (parts per million);

$\sigma x$=Standard deviation of differential movement in the y-direction in ppm (parts per million).

As can be obvious to someone expert in the art the new construction and yarn disposition of the fabric produced according to the present invention gives dimensional stability results that are simply unattainable by plain weave fabrics produced according to the present state of the art.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A woven fabric reinforcement of orthogonal constructions for use as a laminated structure in printed circuit boards, said fabric having a weight per unit area of up to 190 grams per square meter, having warp and weft yarns, comprising a number of warp yarns which is greater than 55% of a total number of warp and weft yarns per unit area, a number of crossovers between warp yarns and weft yarns being between 200 and 315 crossovers per square centimeter.

2. The woven fabric reinforcement of claim 1 having warp and weft yarn disposition such that about 50% of the number of both warp and weft yarns have clockwise torsion of between about 0.4 and 40 turns per meter, and about 50% of the number of both warp and weft yarns have counterclockwise torsion of the same magnitude.

3. The woven fabric reinforcement of claim 1, wherein about 50% of the number of warp yarns have clockwise torsion of between about 0.4 and 40 turns per meter and about 50% of the number of warp yarns have counterclockwise torsion of the same magnitude.

4. The woven fabric reinforcement of claim 1, wherein about 50% of the number of weft yarns have clockwise torsion of between about 0.4 and 40 turns per meter and about 50% of the number of weft yarns have counterclockwise torsion of the same magnitude.

* * * * *